United States Patent
Lenz

(10) Patent No.: US 9,217,784 B2
(45) Date of Patent: Dec. 22, 2015

(54) CONTROL APPARATUS WITH DIFFERENTIAL CONTROL IN A MAGNETICALLY COUPLED COIL SYSTEM FOR A CURRENT-REGULATED AMPLIFIER POWERING FIELD COILS OF A MAGNETIC RESONANCE TOMOGRAPH

(71) Applicant: Helmut Lenz, Oberasbach (DE)

(72) Inventor: Helmut Lenz, Oberasbach (DE)

(73) Assignee: Siemens Aktiengesellschaft, München (DE)

( * ) Notice: Subject to any disclaimer, the term of this patent is extended or adjusted under 35 U.S.C. 154(b) by 541 days.

(21) Appl. No.: 13/659,881

(22) Filed: Oct. 24, 2012

(65) Prior Publication Data

US 2013/0099848 A1    Apr. 25, 2013

(30) Foreign Application Priority Data

Oct. 25, 2011   (DE) .......................... 10 2011 085 171

(51) Int. Cl.
 *G01R 33/385*  (2006.01)
 *G01R 33/3875*  (2006.01)

(52) U.S. Cl.
 CPC ........ *G01R 33/3852* (2013.01); *G01R 33/3875* (2013.01)

(58) Field of Classification Search
 CPC .......................... G01R 33/3852; G01R 33/3875
 USPC ............................................................ 324/322
 See application file for complete search history.

(56) References Cited

U.S. PATENT DOCUMENTS

| | | | | |
|---|---|---|---|---|
| 3,983,505 A | * | 9/1976 | Ishigaki et al. | 330/107 |
| 4,703,275 A | * | 10/1987 | Holland | 324/318 |
| 5,297,033 A | * | 3/1994 | Bito et al. | 324/309 |
| 5,530,356 A | * | 6/1996 | Yokoi | 324/318 |
| 6,025,720 A | | 2/2000 | Lenz et al. | |
| 6,169,403 B1 | * | 1/2001 | Hebrank et al. | 324/318 |
| 6,374,192 B1 | * | 4/2002 | Brogle et al. | 702/107 |
| 6,448,775 B1 | | 9/2002 | Lenz | |
| 6,552,448 B1 | * | 4/2003 | Gegner et al. | 307/77 |
| 2007/0080688 A1 | * | 4/2007 | Hernandez Perez et al. | 324/318 |
| 2013/0099787 A1 | * | 4/2013 | Lu et al. | 324/319 |
| 2013/0099788 A1 | * | 4/2013 | Xu et al. | 324/322 |
| 2013/0234708 A1 | * | 9/2013 | Goora et al. | 324/309 |

FOREIGN PATENT DOCUMENTS

| | | |
|---|---|---|
| DE | 19706756 A1 | 9/1998 |
| DE | 19856800 C1 | 6/2000 |

* cited by examiner

*Primary Examiner* — Rodney Fuller
(74) *Attorney, Agent, or Firm* — Lempia Summerfield Katz LLC

(57) ABSTRACT

A control apparatus for a gradient amplifier includes a differentiation unit. The differentiation unit forms a differentiation signal by differential processing from a current desired value signal of the gradient amplifier. At least one electrical low pass filter unit is connected in series with the differentiation unit, and/or at least one electrical high pass filter unit is connected in parallel with the differentiation unit.

16 Claims, 4 Drawing Sheets

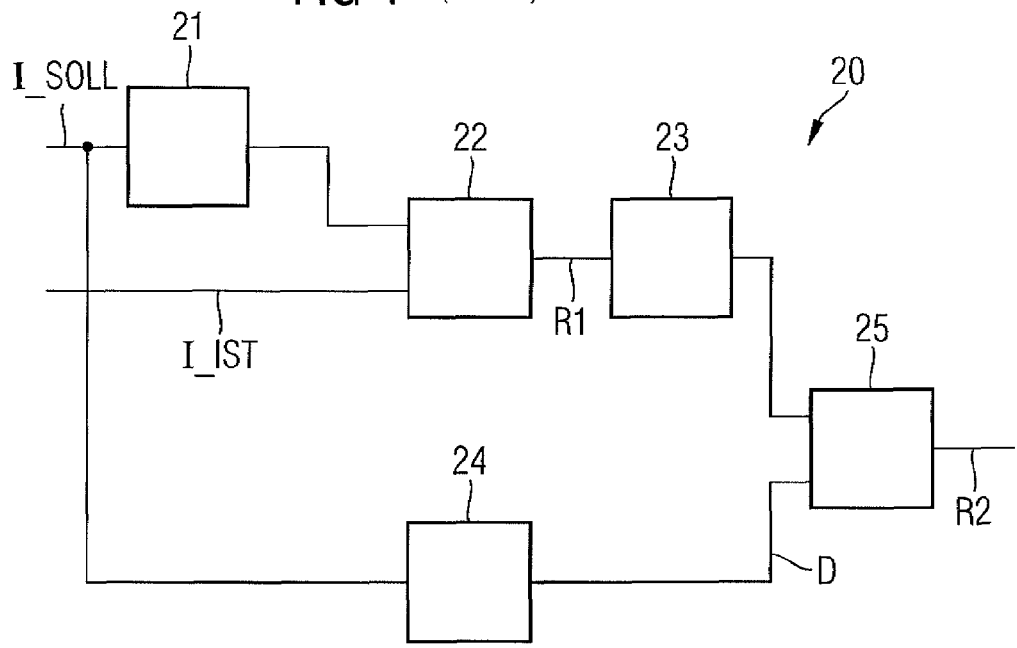
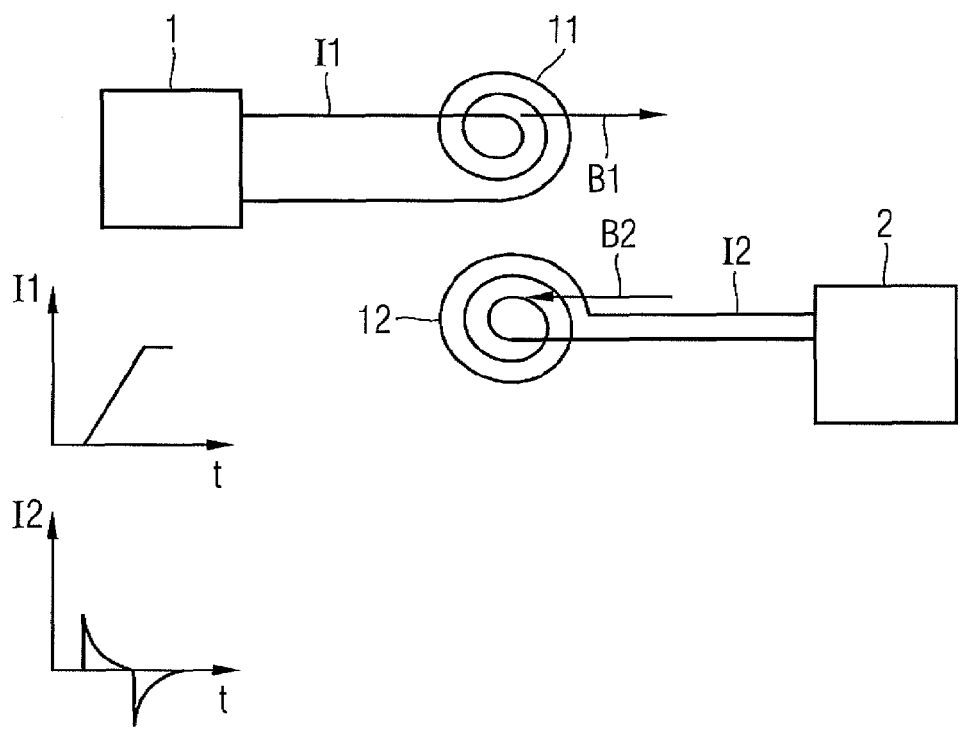

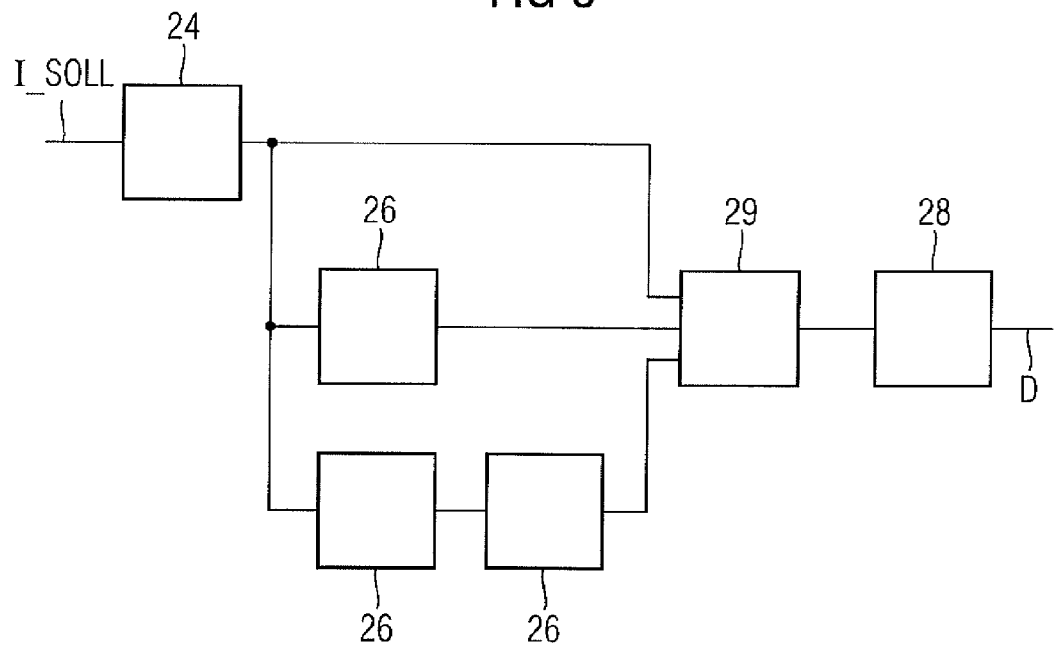
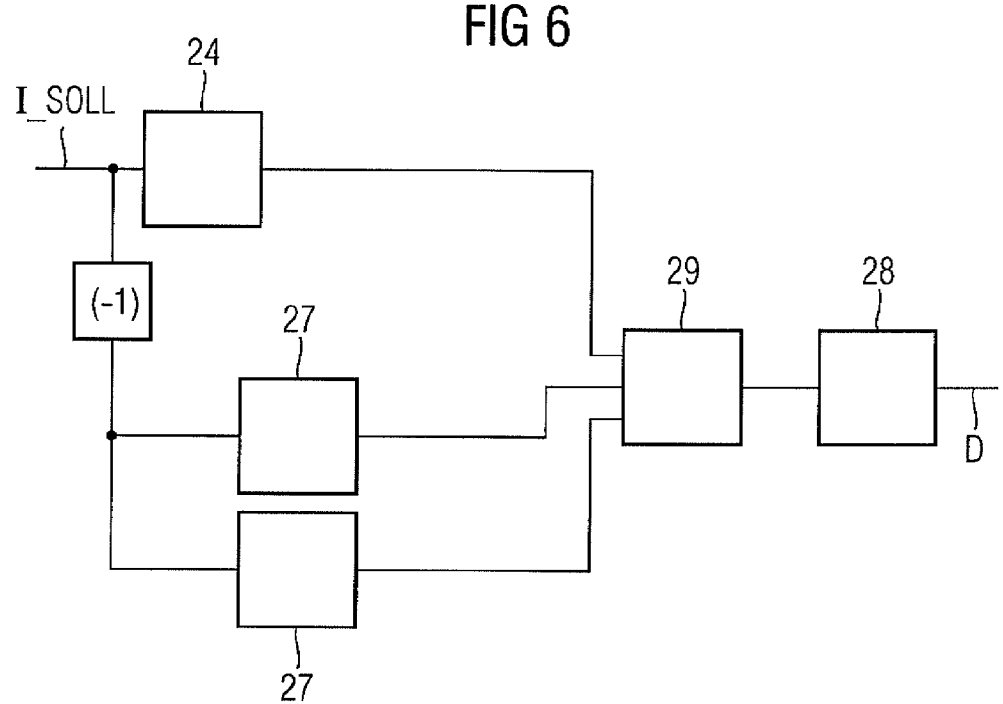

CONTROL APPARATUS WITH DIFFERENTIAL CONTROL IN A MAGNETICALLY COUPLED COIL SYSTEM FOR A CURRENT-REGULATED AMPLIFIER POWERING FIELD COILS OF A MAGNETIC RESONANCE TOMOGRAPH

This application claims the benefit of DE 10 2011 085 171.2, filed on Oct. 25, 2011.

BACKGROUND

The present embodiments relate to a control apparatus for a current-regulated amplifier powering field coils of a magnetic resonance tomograph.

Known magnetic resonance tomography devices may include three gradient coils in order to generate linear magnetic field gradients in the x, y and z directions. A regulated current generated by a gradient or shim amplifier passes through each of the coils. The gradient amplifier includes a current controller for each gradient coil. The properties of the controller are adjusted for the connected gradient coil. A gradient amplifier of this type is described in German patent application DE 197 06 756 A1. The gradient amplifier operates at a purely inductive load, irrespective of the relatively low ohmic resistance losses. The current controller of the amplifier already controls the control deviation during a pulse slope to zero. An unwanted deformation of the pulse nevertheless occurs.

In order to avoid pulse deformations, patent application DE 198 56 800 C1 proposes adding a voltage to the controller output. The added voltage relieves the controller and is proportional to the gradient of the pulse slope of the gradient coil current. The output of an additional differentiation unit that is activated directly by the current desired value is present at the input of a final summation level by way of a calibration resistance. FIG. 1 shows a block diagram of a control apparatus of a gradient amplifier according to DE 198 56 800 C1. A current desired value I-SOLL is fed to a delay unit 21. An output of the delay unit 21 is connected to an input of a comparison unit 22. A current actual value I_IST is present at a further input of the comparison unit 22. A control differential signal R1, which is fed to a control unit 23, is determined in the comparison unit 22. The current desired value I_SOLL is also fed to a differentiation unit 24, which outputs a differential control signal D. The output signal of the control unit 23 and the differential control signal D are fed to inputs of a second summation unit 25. The control signal RS including the output signal of the control unit 23 and the differential control signal D is available at the output of the second summation unit.

In modern magnetic resonance tomography devices (e.g., Connectom by Siemens AG), each gradient coil includes a number of sub-coils. Each of the sub-coils is supplied with current by a gradient amplifier. This results in a magnetic coupling of the sub-coils. The magnetic coupling has repercussions on the gradient amplifier and influences the pulse shape of the gradients. For example, a strong coupling occurs between the Z sub-coils and the X and also Y sub-coils. This coupling is to be taken into account when designing the gradient amplifiers. In addition, the Z, X and Y sub-coils are also coupled to one another, which is essentially lower but still have a negative affect on the current course of the presently pulsing gradient amplifier and/or in the pulsed coil. The individual effect of each sub-coil on the remaining sub-coils (exception Z on X and Z on Y) is low, but the sum of the reactions of all sub-coils on the respectively pulsing sub-coil is not negligible.

SUMMARY AND DESCRIPTION

The present embodiments may obviate one or more of the drawbacks or limitations in the related art. For example, a control apparatus and a gradient amplifier for gradient coils including sub-coils, with which the reaction to the gradient amplifier caused by magnetic couplings of the sub-coils is prevented, are provided.

A control apparatus for a gradient amplifier includes a differentiation unit that forms a differential signal by differential processing from a current desired value signal of the gradient amplifier. At least one electrical low pass filter unit is connected in series with the differentiation unit.

In one embodiment, a control apparatus for a gradient amplifier includes a differentiation unit that forms a differentiation signal by differential processing from a current desired value signal of the gradient amplifier. At least one electrical high pass filter unit is connected in parallel with the differentiation unit.

The present embodiments are advantageous in that the reaction to the gradient amplifier may be significantly reduced by virtue of induced magnetic fields in gradient coils including a number of sub-coils.

In one embodiment, the control apparatus may include at least one low pass filter unit and at least one high pass filter unit.

In a further embodiment, the control apparatus may include a number of electrical low pass filter units connected in parallel and/or in series with one another.

The control apparatus may include a first summation unit. Inputs of the first summation unit are connected to an output of the differentiation unit and an output of the low pass filter unit.

The control apparatus also includes a number of electrical high pass filter units connected in parallel and/or in series with one another.

In one embodiment, the control apparatus includes a first summation unit. Inputs of the first summation unit are connected to the output of the differentiation unit and the output of the high pass filter unit.

In a further embodiment, the control apparatus includes a multiplying unit that is connected to the output of the summation unit and outputs the differential signal.

The control apparatus includes a multiplying unit that is arranged upstream of the differentiation unit.

In one embodiment, a gradient amplifier for a magnetic resonance tomography device is provided. The gradient amplifier includes one embodiment of a control apparatus.

BRIEF DESCRIPTION OF THE DRAWINGS

FIG. 1 shows a control apparatus having a differentiation unit;

FIG. 2 shows one embodiment of two gradient amplifiers having coupled sub-coils;

FIG. 5 shows one embodiment of a control apparatus having a differentiation unit and a number of low pass filter units;

FIG. 6 shows one embodiment of a control apparatus having a differentiation unit and a number of high pass filter units;

DETAILED DESCRIPTION OF THE DRAWINGS

Figure 3:
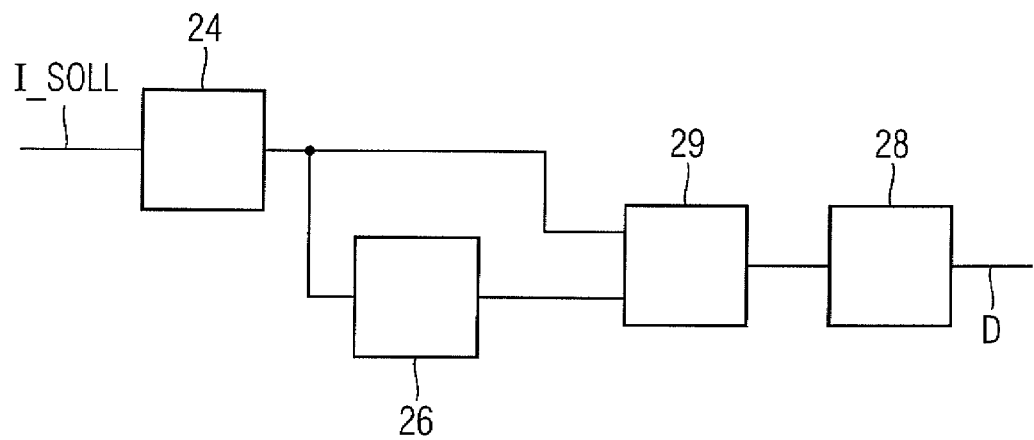
FIG. 3 shows one embodiment of a control apparatus having a differentiation unit and a low pass filter unit.

FIG. 2 shows the coupling problem. FIG. 2 shows a block diagram with 2 coupling sub-coils 11, 12 and two gradient amplifiers 1, 2. A first amplifier 1 guides a first current I1 in the form of a current pulse that immediately increases from zero. A first sub-coil 11 generates a first magnetic flux density B1 proportionally to the first current I1 A part of the first flux density B1 also flows through a second sub-coil 12, inducing a voltage in the second sub-coil 12 and thus a second current I2. The second current I2 in the second sub-coil 12 brings about a second flux density B2 that counteracts the driving first flux density B1. A controlled second amplifier 2 delimits the second current I2 with a control P amplification, and an I portion of its controller controls the second current I2. Provided the controller setting of the second amplifier 2 has no tendency to oscillate, the form of the fading second current I2 is similar to an e-function. If the second current I2 is almost zero, the second amplifier 2 generates a voltage at an output. The voltage generated by the second amplifier 2 counteracts the voltage induced by the pulse slope of the first current I1. If the first current I1 reaches a current limit (e.g., the first current I1 does not experience any further change), no further voltage is also induced in the second sub-coil 12. Since the second amplifier 2 still generates a counter voltage, the second current I2 is generated in the opposite direction. The second amplifier 2 adjusts down, and the second current I2 becomes zero again.

The inductance changes the load in terms of the first amplifier 1. During the pulse slope of the first current I1 the first amplifier 1 generates a voltage according to a temporal change in a difference of the first magnetic flux density B1 and the second magnetic flux density B2. As shown in FIG. 2, the second amplifier 2 may regulate the second current I2 to zero during the slope. The change in current of the second current I1 becomes even smaller, and the temporal change in the second flux density B2 also becomes even smaller. The first amplifier 1 uses a smaller voltage for the current form at the start of the slope than at the end of the slope. In terms of the first amplifier 1, the inductance of the load increases during the pulse slope.

With known gradient amplifiers, it is assumed that the inductance visible for the gradient amplifier remains constant. As a result, the advance control also functions using a differential portion. In the example shown in FIG. 2, a differential advance control provides deformed gradient pulses depending on how large the reaction of all sub-coils is and thus also the change in the inductance in terms of the first coil 1. The control apparatus of the gradient amplifier is therefore adjusted in terms of circuitry by filter units.

FIG. 3 shows a block diagram of a part of a control apparatus 20 with a differentiation unit 24 and an electrical low pass filter unit 26. A signal with a current desired value I_SOLL is present at an input of the differentiation unit 24. An output of the differentiation unit 24 is connected to an input of a first summation unit 29 and to an input of the low pass filter unit 26. An output of the low pass filter unit 26 is connected to an input of the first summation unit 29. In the first summation unit 29, the two incoming signals are summed and weighted. The output of the first summation unit 29 is connected to an input of a multiplying unit 28. A desired differential control signal D is present at an output of the multiplier unit 28. This may then be used according to FIG. 1 for control purposes. With the aid of the multiplying unit 28, the size of the differential control signal D may be adjusted. The multiplying unit 28 may alternatively also be arranged at the input of the differentiation unit 24.

Figure 4:
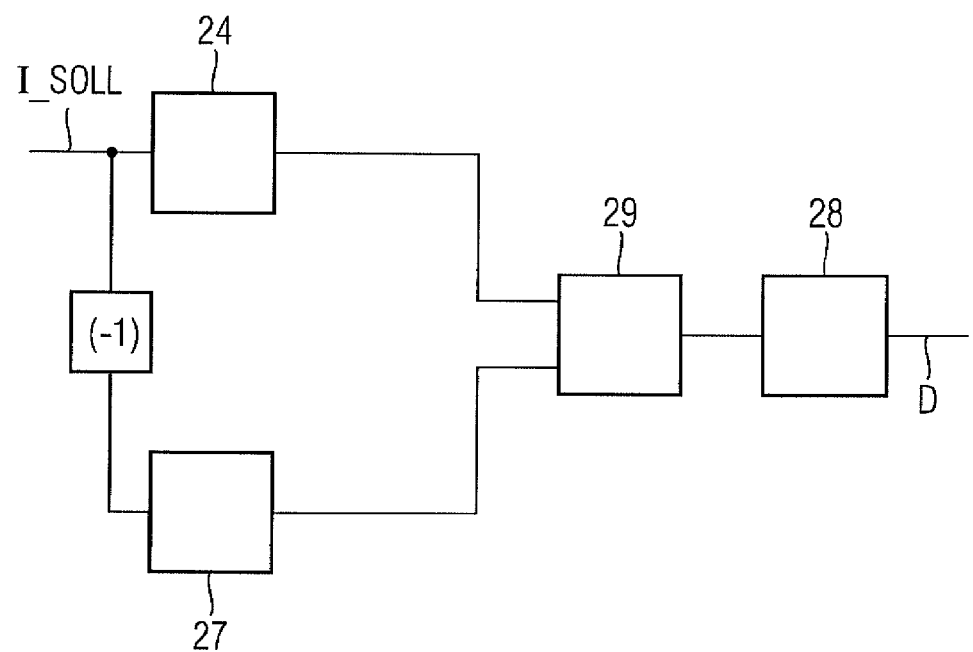
FIG. 4 shows one embodiment of a control apparatus having a differentiation unit and a high pass filter unit.

FIG. 4 shows a block diagram of part of the control apparatus 20 with a differentiation unit 24 and an electrical high pass filter unit 27. The signal with the current desired value I_SOLL is present at the input of the differentiation unit 24. The output of the differentiation unit 24 is connected to an input of a first summation unit 29. The input with the current desired value I_SOLL is inverted and connected to an input of the high pass filter unit 27. The output of the high pass filter unit 27 is also fed to an input of the first summation unit 29. The two incoming signals are summed and weighted in the first summation unit 29. The output of the first summation unit 29 is connected to the input of a multiplying unit 28. The desired differential control signal D is present at the output of the multiplying unit 28. This may then be used according to FIG. 1 for control purposes. The size of the differential control signal D may be adjusted with the aid of the multiplying unit 28. The multiplying unit 28 may alternatively also be arranged at the input of the differentiation unit 24.

FIG. 5 shows a block diagram of a part of the control apparatus 20 with a differentiation unit 24 and a number of electrical low pass filter units 26. The signal with the current desired value I_SOLL is present at the input of the differentiation unit 24. The output of the differentiation unit 24 is connected to an input of a first summation unit 29 and to the inputs of two low pass filter units 26. The output of a low pass filter unit 26 is connected to an input of the first summation unit 29. The output of the other low pass filter unit 26 is fed to the input of a further low pass filter unit 26. The output of this low pass filter unit 26 is fed to a third input of the first summation unit 29. The three incoming signals are summed and weighted in the first summation unit 29. The output of the first summation unit 29 is connected to the input of a multiplying unit 28. The desired differential control signal D is present at the output of the multiplying unit 28. This may be used according to FIG. 1 for control purposes. With the aid of the multiplying unit 28, the size of the differential control signal D may be adjusted. The multiplying unit 28 may alternatively also be arranged at the input of the differentiation unit 24.

FIG. 6 shows a block diagram of part of the control apparatus 20 with a differentiation unit 24 and two electrical high pass filter units 27. The signal with the current desired value I_SOLL is present at the input of the differentiation unit 24. The output of the differentiation unit 24 is connected to an input of a first summation unit. The signal with the current desired value I_SOLL is inverted and fed to the inputs of the two high pass filter units 27. The two outputs of the high pass filter units 27 are connected to inputs of the first summation unit 29. The three incoming signals are summed and weighted in the first summation unit 29. The output of the first summation unit 29 is connected to the input of a multiplying unit 28. The desired differential control signal D is present at the output of the multiplying unit 28. This may then be used according to FIG. 1 for control purposes. The size of the differential control signal D may be adjusted with the aid of the multiplying unit 28. The multiplying unit 28 may alternatively also be arranged at the input of the differentiation unit 24.

Figure 7:
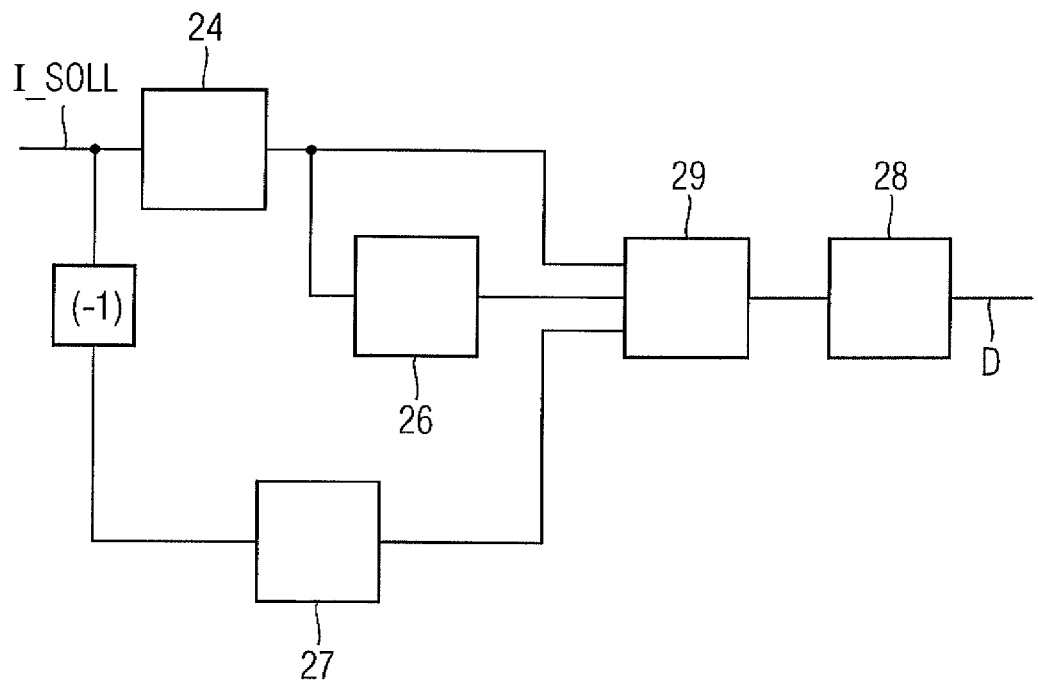
FIG. 7 shows one embodiment of a control apparatus having a differentiation unit, a low pass filter unit and a high pass filter unit.

FIG. 7 shows a block diagram of part of the control apparatus 20 with a differentiation unit 24, an electrical low pass filter unit 26 and an electrical high pass filter unit 27. The signal with the current desired value I_SOLL is present at the input of the differentiation unit 24. The output of the differentiation unit 24 is connected to an input of a first summation unit. The signal with the current desired value I_SOLL is inverted and fed to the input of the high pass filter unit 27. The output of the high pass filter unit 27 is also connected to an input of the first summation unit 29. The output of the differentiation unit 24 is fed to the input of the low pass filter unit 26. The output of the low pass filter unit 26 is connected to a further input of the first summation unit 29. The three incoming signals are summed and weighted in the first summation unit 29. The output of the first summation unit 29 is connected to the input of a multiplying unit 28. The desired differential control signal D is present at the output of the multiplying unit 28. This may then be used according to FIG. 1 for control purposes. The size of the differential control signal D may be adjusted with the aid of the multiplying unit 28. The multiplying unit 28 may alternatively also be arranged at the input of the differentiation unit 24.

Figure 8:
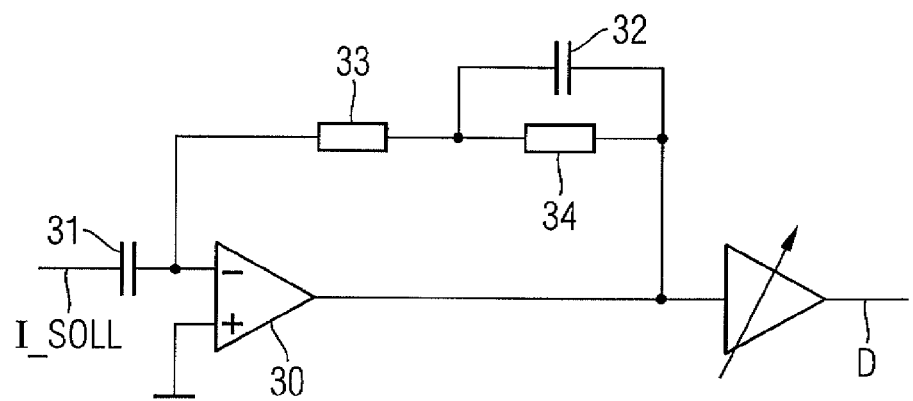
FIG. 8 shows a circuit diagram of one embodiment of a differentiation unit with a low pass filter unit.

FIG. 8 shows a simple circuit-specific analog embodiment with an operational amplifier circuit and a first order low pass filter. A first capacitor 31 and a first resistor 33 in the circuit with the operational amplifier 30 form the differentiation unit 24. A second resistor 34 and a second capacitor 32 connected in parallel thereto form the low pass filter unit 26. The first resistor 33 corresponds to the output voltage of the first gradient amplifier 1 from FIG. 2 at the start of the pulse slope. The sum of the first resistor 33 and the second resistor 34 corresponds to the output voltage once the second current I2 is controlled at zero, and thus, the inductance is at a maximum in terms of the first gradient amplifier 1. The weighting of the summation is provided by the resistance ratio of the first resistor 33 and the second resistor 34. The minimal affect of the ohmic resistance of a gradient coil is disregarded in this respect. The product of the second capacitor 32 and the second resistor 34 produces the time constant of the exponential function of the fading second current I1 from FIG. 2. For adjustment purposes, a multiplying unit 28 with an adjustable amplifier is arranged up- or downstream from the circuit. All illustrated functions may be realized using both analog and also digital technology.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A control apparatus for a gradient amplifier, the control apparatus comprising:
a differentiation unit operable to form a differential signal by differential processing from a current desired value signal of the gradient amplifier;
at least one electrical low pass filter unit connected in series with the differentiation unit; and
at least one electrical high pass filter unit connected in parallel with the differentiation unit.

2. The control apparatus as claimed in claim 1, wherein the at least one electrical low pass filter unit comprises a plurality of electrical low pass filter units connected in parallel or in series with one another.

3. The control apparatus as claimed in claim 2, further comprising a first summation unit, inputs of the first summation unit being connected to an output of the differentiation unit and an output of the at least one electrical high pass filter unit.

4. The control apparatus as claimed in claim 3, further comprising a multiplying unit connected to an output of the first summation unit, the multiplying unit being operable to output the differential signal.

5. The control apparatus as claimed in claim 2, further comprising a first summation unit, inputs of the first summation unit being connected to an output of the differentiation unit and an output of the at least one low pass filter unit.

6. The control apparatus as claimed in claim 2, further comprising a multiplying unit that is arranged upstream of the differentiation unit.

7. The control apparatus as claimed in claim 1, further comprising a first summation unit, inputs of the first summation unit being connected to an output of the differentiation unit and an output of the at least one low pass filter unit.

8. The control apparatus as claimed in claim 1, wherein the at least one electrical high pass filter unit comprises a plurality of electrical high pass filter units connected in parallel or in series with one another.

9. The control apparatus as claimed in claim 1, further comprising a multiplying unit that is arranged upstream of the differentiation unit.

10. An apparatus comprising:
gradient amplifier or shim amplifier for a magnetic resonance tomography device, the gradient amplifier or the shim amplifier comprising:
a control apparatus comprising:
a differentiation unit operable to form a differential signal by differential processing from a current desired value signal of the gradient amplifier; and
at least one electrical low pass filter unit connected in series with the differentiation unit; and
at least one electrical high pass filter unit connected in parallel with the differentiation unit.

11. A control apparatus for a gradient amplifier, the control apparatus comprising:
a differentiation unit operable to form a differentiation signal by differential processing from a current desired value signal of the gradient amplifier; and
at least one electrical high pass filter unit connected in parallel with the differentiation unit.

12. The control apparatus as claimed in claim 11, wherein the at least one electrical high pass filter unit comprises a plurality of electrical high pass filter units connected in parallel or in series with one another.

13. The control apparatus as claimed in claim 11, further comprising a first summation unit, inputs of the first summation unit being connected to an output of the differentiation unit and an output of the at least one electrical high pass filter unit.

14. The control apparatus as claimed in claim 13, further comprising a multiplying unit connected to an output of the first summation unit, the multiplying unit being operable to output the differential signal.

15. The control apparatus as claimed in claim 14, further comprising a multiplying unit that is arranged upstream of the differentiation unit.

16. The control apparatus as claimed in claim 11, further comprising a multiplying unit that is arranged upstream of the differentiation unit.

* * * * *

UNITED STATES PATENT AND TRADEMARK OFFICE
CERTIFICATE OF CORRECTION

PATENT NO. : 9,217,784 B2
APPLICATION NO. : 13/659881
DATED : December 22, 2015
INVENTOR(S) : Helmut Lenz Page 1 of 1

It is certified that error appears in the above-identified patent and that said Letters Patent is hereby corrected as shown below:

In the claims:
Column 6, Claim 10, Line 29 - --a-- needs to be inserted before "gradient"

Signed and Sealed this
Twenty-third Day of August, 2016

Michelle K. Lee
*Director of the United States Patent and Trademark Office*